United States Patent
Azuma

(10) Patent No.: US 9,108,342 B2
(45) Date of Patent: Aug. 18, 2015

(54) METHOD OF FORMING FILM, METHOD OF FORMING PATTERN, AND METHOD OF MANUFACTURING SEMICONDUCTOR DEVICE

(75) Inventor: Tsukasa Azuma, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 62 days.

(21) Appl. No.: 13/414,754

(22) Filed: Mar. 8, 2012

(65) Prior Publication Data

US 2013/0078817 A1 Mar. 28, 2013

(30) Foreign Application Priority Data

Sep. 22, 2011 (JP) .................. 2011-208116

(51) Int. Cl.
H01L 21/302 (2006.01)
B29C 33/38 (2006.01)
G03F 7/00 (2006.01)
H01L 21/67 (2006.01)
B82Y 10/00 (2011.01)
B82Y 40/00 (2011.01)

(52) U.S. Cl.
CPC ............. B29C 33/3842 (2013.01); B82Y 10/00 (2013.01); B82Y 40/00 (2013.01); G03F 7/0002 (2013.01); H01L 21/67092 (2013.01)

(58) Field of Classification Search
USPC ........................................................ 438/758
See application file for complete search history.

(56) References Cited

U.S. PATENT DOCUMENTS

| | | | |
|---|---|---|---|
| 7,794,222 B2 * | 9/2010 | Suehira et al. | 425/150 |
| 7,960,090 B2 * | 6/2011 | Terasaki et al. | 430/270.1 |
| 8,142,703 B2 * | 3/2012 | Xu et al. | 264/293 |
| 8,382,466 B2 | 2/2013 | Hubert | 425/385 |
| 8,652,393 B2 * | 2/2014 | Khusnatdinov et al. | 264/496 |
| 2010/0078846 A1 * | 4/2010 | Resnick et al. | 264/101 |
| 2010/0314799 A1 * | 12/2010 | Suehira et al. | 264/293 |
| 2013/0096033 A1 * | 4/2013 | Routenberg | 506/26 |
| 2014/0117574 A1 * | 5/2014 | Khusnatdinov et al. | 264/40.5 |

FOREIGN PATENT DOCUMENTS

| | | |
|---|---|---|
| JP | 2006-110997 | 4/2006 |
| JP | 2009-190300 | 8/2009 |
| JP | 2010-206189 | 9/2010 |
| JP | 2010-286618 | 12/2010 |
| JP | 2011-16351 | 1/2011 |

* cited by examiner

*Primary Examiner* — Telly Green
*Assistant Examiner* — Damian A Hillman
(74) *Attorney, Agent, or Firm* — Finnegan, Henderson, Farabow, Garrett & Dunner, L.L.P.

(57) ABSTRACT

According to an embodiment, a method of forming a film is provided. In the method of forming a film, a reversed pattern which is the reverse of a desired layout pattern is formed on a first substrate. Subsequently, a pattern material of the desired layout pattern is supplied to a second substrate as a reversal material. Thereafter, the reversed pattern is brought into contact with the reversal material such that the reversed pattern faces the reversal material, so that the reversed pattern is filled with the reversal material by a capillary phenomenon.

23 Claims, 5 Drawing Sheets

US 9,108,342 B2

METHOD OF FORMING FILM, METHOD OF FORMING PATTERN, AND METHOD OF MANUFACTURING SEMICONDUCTOR DEVICE

CROSS-REFERENCE TO RELATED APPLICATIONS

This application is based upon and claims the benefit of priority from Japanese Patent Application No. 2011-208116, filed on Sep. 22, 2011; the entire contents of which are incorporated herein by reference.

FIELD

Embodiments disclosed herein relate generally to a method of forming a film, a method of forming a pattern, and a method of manufacturing a semiconductor device.

BACKGROUND

In imprint lithography such as nanoimprint lithography, when a template pattern has a sparse pattern density, it takes a long time to fill the template pattern with a resist. For such a reason, an imprint pattern is formed on a wafer by using a template pattern which is the reverse of a desired template pattern, and then a reversal material is formed on the wafer as a film. Subsequently, the imprint pattern is removed, leaving the reversal material, so that the desired pattern on the waver, which is the reverse of the imprint pattern, is formed.

However, when a density difference occurs within the imprint pattern formed on the wafer, at the time when the imprint pattern is removed, even a film of an underlying layer (an underlying layer film) is etched at the portion where a pattern density is sparse. Therefore there was a problem that damage was caused to a base substrate. Accordingly there has been the demand for a method of forming a pattern on a wafer using a reversal material without causing damage to an underlying layer film.

DETAILED DESCRIPTION

In general, according to an embodiment, a method of forming a film is provided. In the film forming method, a reversed pattern which is the reverse of a desired layout pattern is formed on a first substrate. Then, a pattern material of the desired layout pattern is supplied onto a second substrate as a reversal material. Thereafter, the reversed pattern is brought into contact with the reversal material such that the reversed pattern faces the reversal material, so that the reversal material is enabled to fill the spaces in the reversed pattern by a capillary phenomenon. Then, the second substrate is separated from the reversal material.

Exemplary embodiments of a method of forming a film, a method of forming a pattern, and a method of manufacturing a semiconductor device will be explained below in detail with reference to the accompanying drawings. The present invention is not limited to the following embodiments.

First Embodiment

Figure 1:
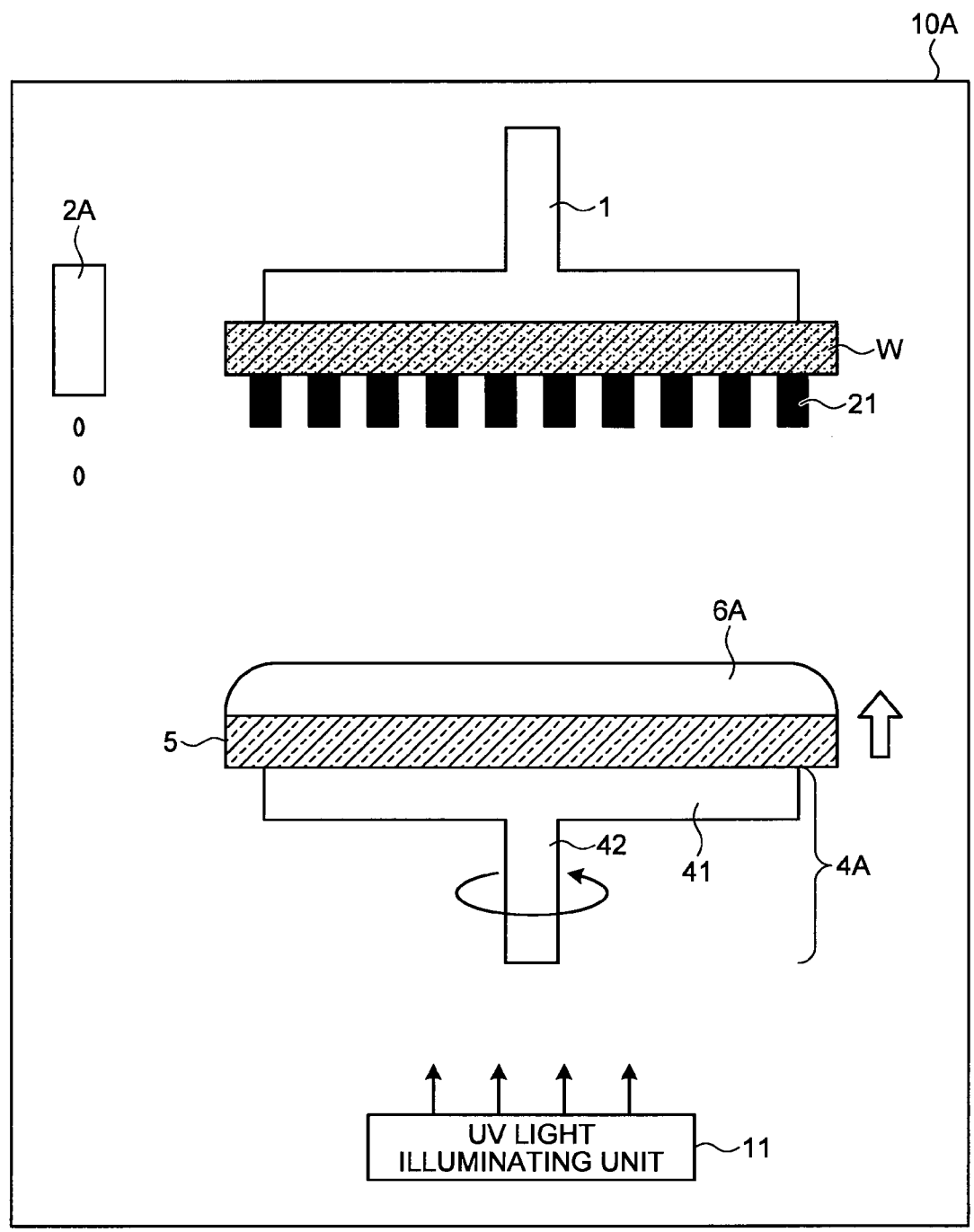
FIG. 1 is a diagram illustrating a configuration of a film forming apparatus according to a first embodiment.

FIG. 1 is a diagram illustrating a configuration of a film forming apparatus according to a first embodiment. A film forming apparatus 10A is an apparatus for forming a film of a reversal material 6A on a substrate such as a wafer W (a first substrate). The film forming apparatus 10A of this embodiment forms a film, which makes an imprint pattern 21 reversed, (a reversal material 6A) on the imprint pattern 21 (a reversed pattern) formed on the wafer W. The film forming apparatus 10A is equipped with a substrate supporting unit 1, a reversal material supplying unit 2A, a supply target plate 5 (a second substrate), a plate rotating unit 4A, and a UV light illuminating unit 11.

The substrate supporting unit 1 holds the wafer W from the back side thereof by, for example, vacuum adsorption such that the front surface of wafer W is put face down in the vertical direction. An imprint pattern 21 is formed on the front surface of the wafer W using imprint lithography such as nanoimprint lithography. The imprint pattern 21 here is a pattern which is the reverse of the desired pattern to be formed on the wafer W. In other words, when the imprint pattern 21 is reversed, it will be the desired pattern to form on the wafer W. Therefore the imprint pattern 21 on the wafer W is formed using a template pattern which is the reverse of the template pattern used to form the desired pattern on the wafer W.

A reversal material supplying unit 2A is an apparatus which supplies a supply target plate 5 with a material (reversal material 6A) of a film to be formed on the wafer W. At the time when the reversal material 6A is supplied to the supply target plate 5, the reversal material supplying unit 2A moves up to above the supply target plate 5. When the supply of reversal material 6A to supply target plate 5 is finished, the reversal material supplying unit 2A moves to a location where it is distanced from the supply target plate 5. For example, the reversal material 6A is a liquid material containing silicon (for example, SOG: Spin On Glass).

The supply target plate 5 is a plate-shaped member that stores the reversal material 6A supplied from the reversal material supplying unit 2A. The supply target plate 5 includes a principal surface which is substantially circular and bigger than a principal surface of the wafer W and stores the reversal material 6A on the front surface side. The back side of the supply target plate 5 is fixed by the plate rotating unit 4A. The supply target plate 5 may be formed as a transparent substrate such as a glass substrate.

The plate rotating unit 4A is an apparatus for causing the supply target plate 5 to rotate, and is configured to include a fixing portion 41 and a rotary shaft 42. The fixing portion 41 of the plate rotating unit 4A fixes the supply target plate 5 from the back side. On the back side of the fixing unit 41, the rotary shaft 42 is joined with the center of the back side. The plate rotating unit 4A is formed as a transparent member such as a glass.

When the supply target plate 5 is supplied with the reversal material 6A from the reversal material supplying unit 2A, the rotary shaft 42 rotates, and this rotation causes the fixing portion 41 and the supply target plate 5 on the fixing portion 41 to rotate. Through this operation, the reversal material 6A is spin-coated on the supply target plate 5 in the film forming apparatus 10A.

In addition, the plate rotating unit 4A is configured to be movable in the vertical direction. When the reversal material 6A is supplied to the supply target plate 5 from the reversal material supplying unit 2A, the plate rotating unit 4A moves down to separate the substrate supporting unit 1 from the plate rotating unit 4A by a predetermined distance. When filling the imprint pattern 21 with the reversal material 6A, the plate rotating unit 4A is lifted up toward the wafer W, and is lowered down toward the UV light illuminating unit 11 at the time when the imprint pattern 21 is completely filled with the reversal material 6A.

The UV light illuminating unit 11 is arranged on the back side of the plate rotating unit 4A and illuminates the reversal material 6A with UV light through the plate rotating unit 4A and the supply target plate 5, which are formed as transparent members. The reversal material 6A is illuminated with UV light to be cured.

Next, a sequence of a pattern forming process (a sequence of a reversing process) according to the first embodiment will be described. FIGS. 2A to 2D are diagrams illustrating the pattern forming process according to the first embodiment. An imprint pattern 21, which is the reverse of a desired pattern to be formed on the wafer W, is formed on the front surface of a wafer W. The substrate supporting unit 1 supports the wafer W from the back side.

Figure 2A:
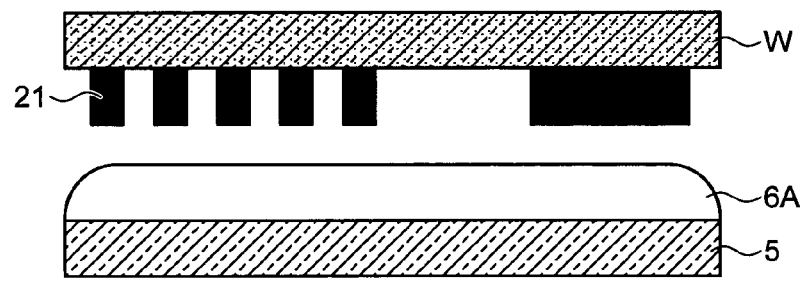
FIGS. 2A to 2D are diagrams describing a sequence of a pattern forming process according to the first embodiment.
Figure 2A:

The reversal material supplying unit 2A supplies the supply target plate 5 with a reversal material 6A serving as the material of a film to be formed on the wafer W. In this case, the plate rotating unit 4A causes the supply target plate 5 to rotate. The reversal material 6A is formed as a film on the supply target plate 5 in the film forming apparatus 10A as illustrated in FIG. 2A.

Figure 2B:
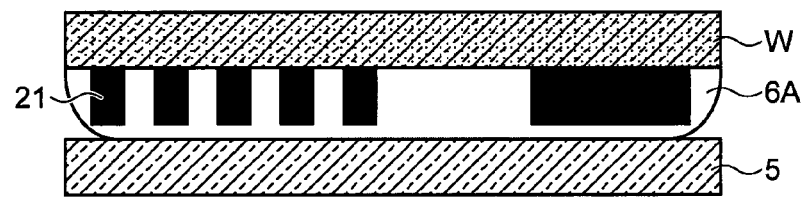
Figure 2B:

Thereafter, the plate rotating unit 4A moves the supply target plate 5 with the reversal material 6A formed thereon such that the supply target plate 5 approaches the wafer W, thereby bringing the reversal material 6A into contact with the imprint pattern 21 on the wafer W such that the reversal material 6A faces the wafer W. After this, as illustrated in FIG. 2B, concave portions (pattern spaces) of the imprint pattern 21 are filled with the reversal material 6A by a capillary phenomenon. Here, the filling process is a process similar to imprint lithography using a template. Therefore the wafer W here corresponds to a template, and the imprint pattern 21 corresponds to the template pattern. Further, the reversal material 6A corresponds to an imprint resist.

After this, the UV light illuminating unit 11 illuminates the reversal material 6A with UV light from the back side of the plate rotating unit 4A in a state in which the plate rotating unit 4A makes the reversal material 6A be in contact with the wafer W. Because of this, the reversal material 6A that has filled the imprint pattern 21 is cured.

Figure 2C:
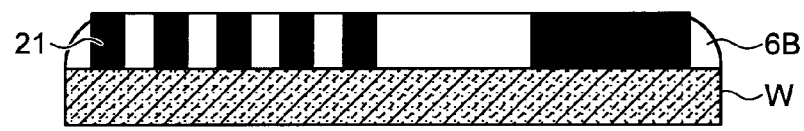
Figure 2C:

After the reversal material 6A is cured, the plate rotating unit 4A is lowered down and thus the supply target plate 5 is separated from the reversal material 6A (mold releasing). Next, the reversal material 6A that has filled the imprint pattern 21 is etched back, so that, as illustrated in FIG. 2C, the top surfaces of convex portions of the imprint pattern 21 are exposed. Accordingly, the reversal material 6A is partially etched at the top surface portion and thus becomes a reversal material 6B. In the wafer W, the top surfaces of the convex portions of the imprint pattern 21 and the top surface of the reversal material 6B are substantially equal in height, and thus the top surface of the wafer W becomes substantially flat.

Figure 2D:
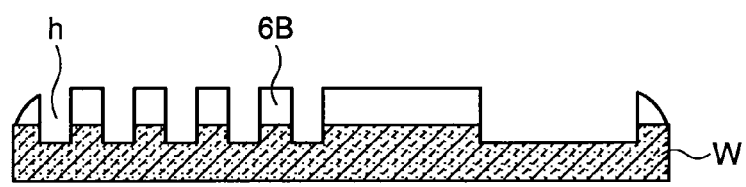

Thereafter, as illustrated in FIG. 2D, the imprint pattern 21 is selectively removed by etching so that only the reversal material 6B remains. The pattern formed of the reversal material 6B is a pattern (desired pattern) which is the reverse of the imprint pattern 21. For example, as the imprint pattern 21 is removed, a hole pattern h is formed at the position where the imprint pattern 21 has been rested. Thereafter, the wafer W undergoes the next process in the next step.

Figure 3A:
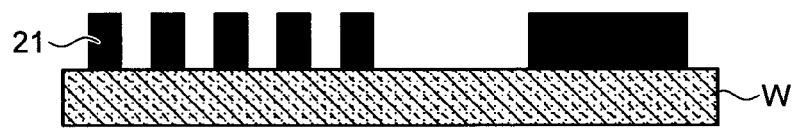
FIGS. 3A to 3D are diagrams for describing a sequence of a pattern forming process when a reversal material is directly applied onto a wafer.

Hereinbelow, a sequence of processes of a pattern forming method concerning a case in which the reversal material is directly applied on the wafer W will be described. FIGS. 3A to 3D are diagrams describing a sequence of a pattern forming process concerning a case in which the reversal material is directly applied on the wafer. As illustrated in FIG. 3A, an imprint pattern 21, which is the reverse of a desired pattern, is formed on the front surface of the wafer W.

Figure 3B:
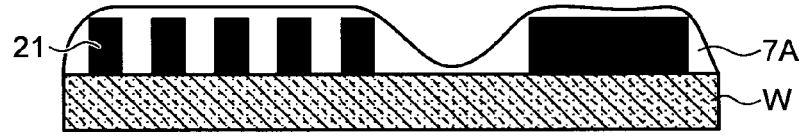

As illustrated in FIG. 3B, a reversal material 7A serving as a material of film to be formed on the wafer W is applied to the imprint pattern 21 by a spin coating method or the like. When the reversal material 7A is spin-coated on the wafer W, there is a difference in the film thickness of the reversal material 7A between a portion with a sparse pattern density and a portion with a dense pattern density in the imprint pattern 21. Specifically, the film thickness of the reversal material 7A is small at the portion with a sparse pattern density and large at the portion with a dense pattern density.

Figure 3C:
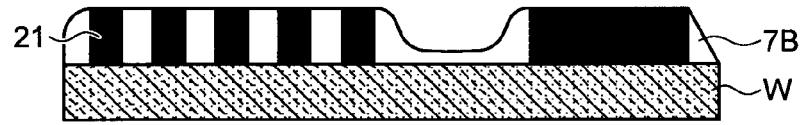

After that, the reversal material 7A, formed as a film on the imprint pattern 21, is etched back so that the top surfaces of convex portions of the imprint pattern 21 are exposed as illustrated in FIG. 3C. Through this process, the reversal material 7A is partially etched at the top surface portion and thus becomes a reversal material 7B. As a result, at the portion with a dense pattern density within the imprint pattern 21, the top surface of the imprint pattern 21 and the top surface of the reversal material 7B may be substantially equal in height. On the other hand, at the portion with a sparse pattern density within the imprint pattern 21, the film thickness of the reversal material 7B is relatively small.

Figure 3D:
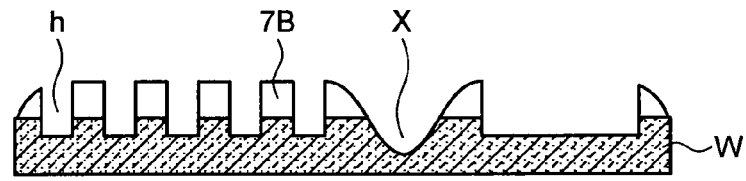

The imprint pattern 21 is selectively removed by etching as illustrated in FIG. 3D and the reversal material 7B remains. The pattern formed of the reversal material 7B is a pattern which is the reverse of the imprint pattern 21. The hole pattern h is formed at the portion where the pattern density of the imprint pattern 21 has been dense. On the other hand, since the film thickness of the reversal material 7B is small at the portion X where the pattern density of the imprint pattern 21 has been sparse, the etching is executed up to an underlying layer of the reverse material 7B. Therefore the film thickness of the portion X with the sparse pattern density is excessively thin. This may result in damage to the wafer W (the underlying layer of the imprint pattern 21).

By using the pattern forming processing described with reference to FIGS. 2A to 2D, the pattern formation can be performed using the reversal material 7B without causing damage to the wafer W (the underlying layer of the imprint pattern 21) regardless of the density (sparse or dense) of the pattern in the imprint pattern 21. Accordingly, filling failure of the reversal material can be solved.

In addition, in this embodiment, a mold releasing process is performed after the UV illumination. However, the UV illumination may be performed after the mold releasing process. Specifically, before the reversal material 6A is cured, the plate rotating unit 4A is lowered down so that the supply target plate 5 is separated from the reversal material 6A. After that, the reversal material 6A is illuminated with UV light from the back side of the plate rotating unit 4A. By this process, the reversal material 6A that has filled the imprint pattern 21 is cured. Since the UV illumination is performed after the mold releasing process, the reversal material 6A can be easily separated from the supply target plate 5.

In this embodiment, the film forming apparatus 10A is equipped with the supply target plate 5. However, the film forming apparatus 10A and the supply target plate 5 may be configured as separate parts. At the time when the imprint material 21 is filled with the reversal material 6A or at the time when the reversal material 6A is removed from the supply target plate 5, the substrate supporting unit 1 may be lowered down in the vertical direction.

As such, according to the first embodiment, because the reversal material 6A is enabled to fill the concave portions (pattern spaces) of the imprint pattern 21 by a capillary phenomenon, the reversal material 6A can be uniformly formed as a film on the wafer W. Therefore the pattern, which is the reverse of the imprint pattern 21 (the pattern formed of the reversal material 6B), can be formed without causing damage to the underlying layer present under the imprint pattern 21 when the imprint pattern 21 is removed. In other words, the reversal material 6A, that can make the imprint pattern 21 reversed, can be formed on the wafer W without giving damage to the underlying film. Moreover, since the reversal material 6A is supplied to the supply target plate 5 by the spin coating, the reversal material 6A can be supplied to the supply target plate 5 in a short time.

Second Embodiment

Next, a second embodiment of the invention will be described using FIG. 4. In the second embodiment, a reversal material 6A is supplied to a supply target plate 5 by an ink jet type of liquid droplet dropping apparatus. In addition, the reversal material 6A may be cured by a baking heater.

Figure 4:
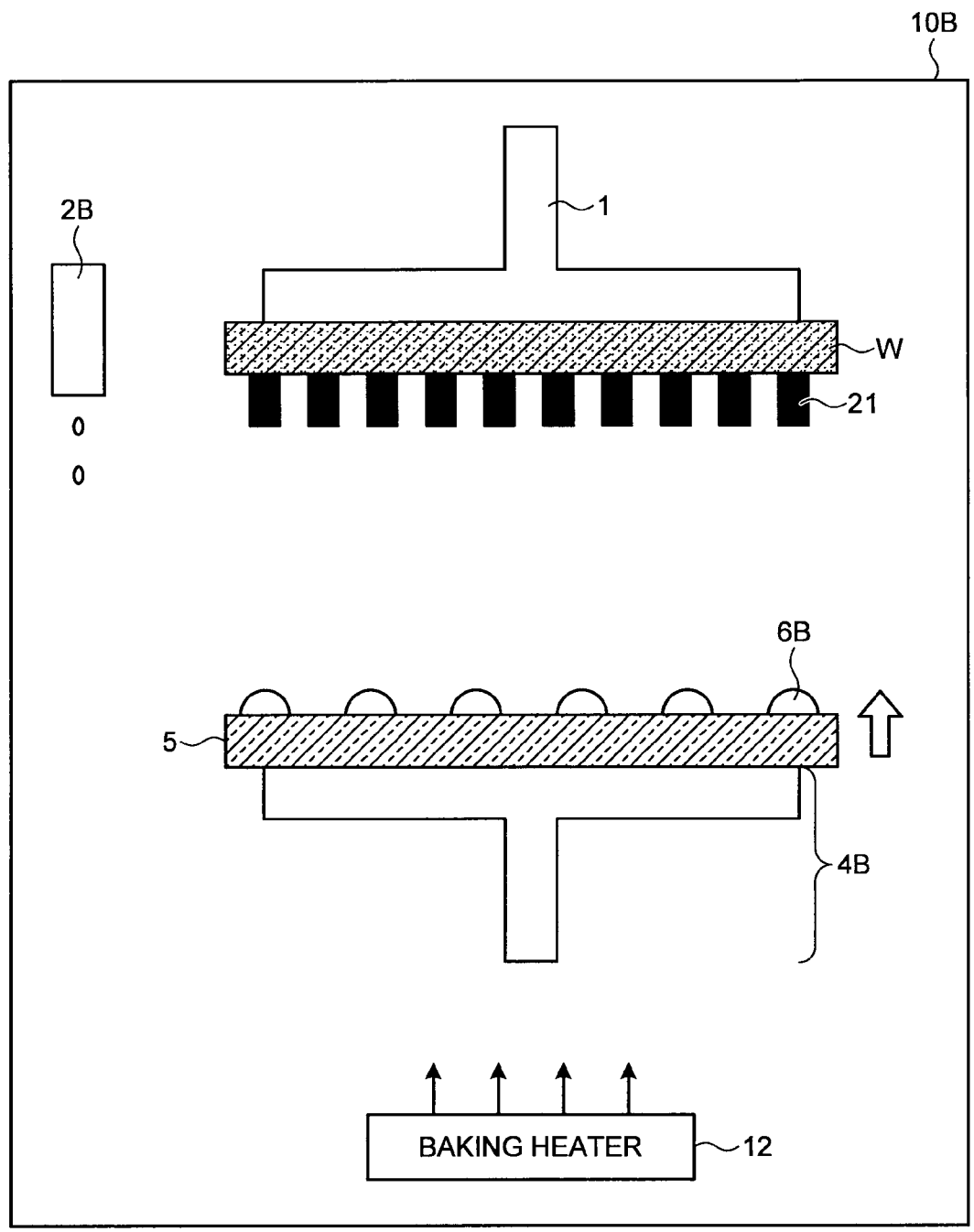
FIG. 4 is a diagram illustrating a configuration of a film forming apparatus according to a second embodiment.

FIG. 4 is a diagram illustrating a configuration of a film forming apparatus according to the second embodiment. Among each of components of FIG. 4, components that function in the same manner as those of the film forming apparatus 10A according to the first embodiment illustrated in FIG. 1, are denoted by the same reference numerals and the redundant description thereof will not be given.

A film forming apparatus 10B of this embodiment is equipped with a reversal material supplying unit 2B instead of the reversal material supplying unit 2A, is equipped with a baking heater 12 instead of the UV light illuminating unit 11, and is equipped with a plate supporting unit 4B instead of the plate rotating unit 4A, compared with the film forming apparatus 10A.

The reversal material supplying unit 2B is an ink jet type of liquid droplet dropping apparatus and applies a droplet-like reversal material 6A onto a supply target plate 5 by an ink jet coating method. The baking heater 12 is arranged on the back side of the plate supporting unit 4B to transmit heat to the reversal material 6A from the back side of the plate supporting unit 4B. The reversal material 6A is cured by the heat transmitted from the baking heater 12.

The plate supporting unit 4B fixes a supply target plate 5 from the back side. In addition, the plate supporting unit 4B is configured to be movable in the vertical direction. When the reversal material 6B is supplied to the supply target plate 5 from the reversal material supplying unit 2B, the plate supporting unit 4B is lowered down to increase a distance between the substrate supporting unit 1 and the plate supporting unit 4B by a predetermined distance. The plate supporting unit 4B is lifted toward the wafer W at the time when the imprint pattern 21 is filled with the reversal material 6B, and is lowered toward the baking heater 12 at the time when the filling of the imprint pattern 21 with the reversal material 6B is finished.

A pattern forming process according to the second embodiment (pattern forming process using the film forming apparatus 10B) is the same as the pattern forming process according to the first embodiment (pattern forming process using the film forming apparatus 10A) in terms of the processing sequence. That is, an imprint pattern 21 is formed on the front surface of a wafer W. A reversal material supplying unit 2B supplies a supply target plate 5 with a liquid droplet-like reversal material 6B. At this time, the reversal material 6B is arranged at the location corresponding to the pattern shape of the imprint pattern 21.

After that, the reversal material 6B is brought into contact with the wafer W such that the reversal material 6B faces the wafer W. Concave portions (pattern spaces) of the imprint pattern 21 are filled with the reversal material 6B by a capillary phenomenon. Subsequently, the reversal material 6B is heated by the baking heater 12 in a state in which the reversal material 6B still remains in contact with the wafer W. Through this process, the reversal material 6B that has filled the imprint pattern 21 is cured.

After the reversal material 6B is cured, the supply target plate 5 is separated from the reversal material 6B (mold releasing). Next, the reversal material 6B that has filled the imprint pattern 21 is etched back so that the top surfaces of convex portions of the imprint pattern 21 can be exposed. With this process, the reversal material 6B will be etched on the top surface portion to become a reversal material 6B. Accordingly, in the wafer W, the top surfaces of the convex portions of the imprint pattern 21 and the top surface of the reversal material 6B may be substantially equal in height, and the top surface of the wafer W may become substantially flat. Thereafter, the imprint pattern 21 is selectively removed by etching, and the reversal material 6B is left.

Furthermore, in this embodiment, the description is given concerning a case in which the film forming apparatus 10B is equipped with the reversal material supplying unit 2B and the plate supporting unit 4B. However, the filing forming apparatus 10B may be equipped with the reversal material supplying unit 2A and the plate rotating unit 4A in place of the reversal material supplying unit 2B and the plate supporting unit 4B. In addition, in this embodiment, the description is given concerning a case in which the film forming apparatus 10B is equipped with the baking heater 12, but it may be equipped with the UV light illuminating unit 11 in place of the baking heater 12.

In addition, the layout position of the baking heater 12 is not limited to the back side of the plate supporting unit 4B. The baking heater 12 may be arranged, for example, higher than the substrate supporting unit 1 or may be arranged inside the plate supporting unit 4B or inside the substrate supporting unit 1. In addition, in this embodiment, the supply target plate 5 may be configured as a nontransparent substrate (a silicon substrate, a metallic substrate, or the like).

As such, according to the second embodiment, since the reversal material 6A fills the concave portions (pattern spaces) of the imprint pattern 21 by the capillary phenomenon, the reversal material 6A can be uniformly formed as a film on the wafer W. Therefore, at the time when the imprint pattern 21 is removed, the pattern (the pattern formed of the reversal material 6B), which is the reverse of the imprint pattern 21, can be formed without causing damage to the underlying film of the imprint pattern 21. In other words, the reversal material 6A that can reverse the imprint pattern 21 without causing damage to the underlying film can be formed on the wafer W. In addition, because the reversal material 6A is supplied to the supply target plate 5 in the form of liquid droplets, the concave portions of the imprint pattern 21 can be filled with a small amount of the reversal material 6A.

Third Embodiment

Next, a third embodiment of the invention will be described using FIG. 5. In the third embodiment, concave portions of an imprint pattern 21 is filled with a reversal material 6A using a capillary phenomenon under the conditions of reduced pressure and cooling.

Figure 5:
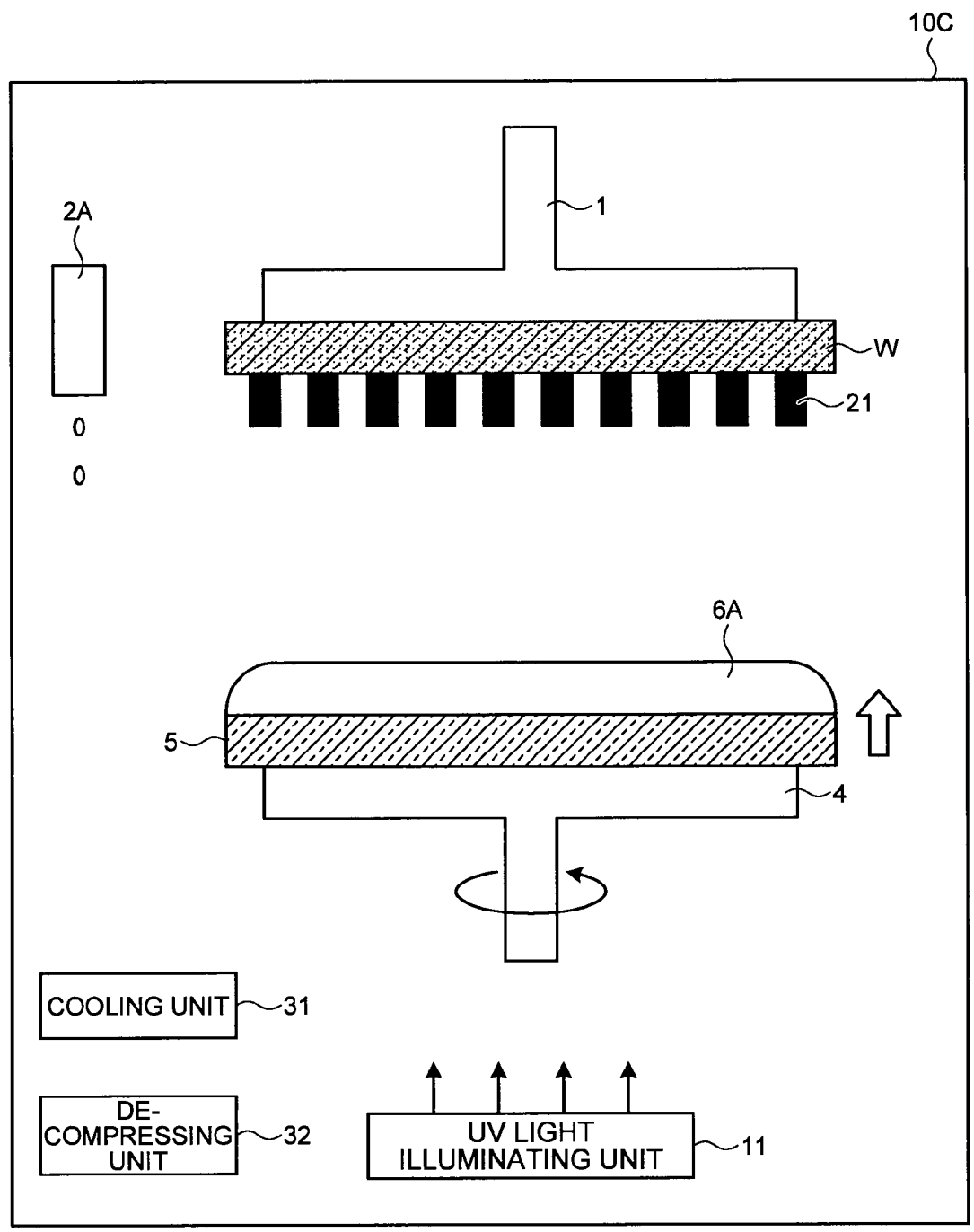
FIG. 5 is a diagram illustrating a configuration of a film forming apparatus according to a third embodiment.

FIG. 5 is a diagram illustrating a configuration of a film forming apparatus according to the third embodiment. Among each of components of FIG. 5, components that function in the same way as those of the film forming apparatus 10A according to the first embodiment illustrated in FIG. 1 are denoted by the same reference numerals and the redundant description thereof will not be given.

A film forming apparatus 10C of this embodiment is equipped with a cooling unit 31 and a decompressing unit 32 in addition to the components of the film forming apparatus 10A. The cooling unit 31 cools a reversal material 6A which fills concave portions of an imprint pattern 21. The decompressing unit 32 reduces the inside pressure of the film forming apparatus 10C to below atmospheric pressure at the time when the concave portions of the imprint pattern 21 are filled with the reversal material 6A.

At the time when the concave portions of the imprint pattern 21 are filled with the reversal material 6A, when the pressure in the vicinity of the imprint pattern 21 or the temperature of the reversal material 6A changes, the filling speed also changes. Because of this, with this embodiment, in order for the filling speed to improve, the pressure in the vicinity of the imprint pattern 21 or the temperature of the reversal material 6A is controlled.

Generally, a rising height h (unit: m) of a liquid level (reversal material 6A) by the capillary phenomenon is expressed by the following Formula (1).

[Formula 1]

$$h = \frac{2T\cos\theta}{\rho g r} \quad (1)$$

T=surface tension (N/m)
θ=angle of contact
ρ=density of liquid (kg/m$^3$)
g=acceleration due to gravity (m/s$^2$)
r=inside diameter (radius) of tube (m)

Furthermore, the liquid here corresponds to the reversal material 6A, and the tube corresponds to the concave portion of the imprint pattern 21.

In addition, according to the law of Eotvos, the relation between the surface tension and the temperature are expressed by the following Formula (2).

[Formula 2]

$$\gamma = k(T_c - T)\left(\frac{d}{M}\right)^{\frac{2}{3}} \quad (2)$$

Tc=critical temperature
γ=surface tension (N/m)
d=density
M=molecular weight

Furthermore, constant k is about 2 (cm$^2$·mol$^{-2/3}$·s$^{-2}$·K$^{-1}$) regardless of the type of liquid.

Therefore, in this embodiment, before the concave portions of the imprint pattern 21 are filled with the reversal material 6A, the reversal material 6A, with which the concave portions of the imprint pattern 21 are filled, are cooled by the cooling unit 31. For example, the cooling unit 31 cools the reversal material 6A to the temperature (below room temperature) (for example 10° C.) lower than the outside temperature of the film forming apparatus 10C. The cooling unit 31 may cool the reversal material 6A inside the reversal material supplying unit 2A (the reversal material 6A before being supplied to the supply target plate 5) or may cool the reversal material 6A on the supply target plate 5. When the reversal material 6A on the supply target plate 5 is cooled, the cooling unit 31 cools the reversal material 6A by, for example, cooling the supply target plate 5. In addition, before the concave portions of the imprint pattern 21 are filled with the reversal material 6A, the decompressing unit 32 may reduce the inside pressure of the film forming apparatus 10C to below atmospheric pressure.

This operation increases the surface tension of the reversal material 6A which is an Si-based reversal material. As a result, the concave portions (contact hole pattern and the like) of the imprint pattern 21, which is formed on the wafer W, can be uniformly filled with the reversal material 6A at high speed.

Furthermore, in this embodiment, the film forming apparatus 10C is configured by adding the cooling unit 31 and the decompressing unit 32 to the configuration of the film forming apparatus 10A, but it may be configured by adding the cooling unit 31 and the decompressing unit 32 to the configuration of the film forming apparatus 10B. In addition, the film forming apparatus 10C is configured by including both of the cooling unit 31 and the decompressing unit 32, but it may be configured by only either one of the cooling unit 31 and the decompressing unit 32.

A filling process of filling the imprint pattern 21 with the reversal material 6A and a reversed-pattern forming process using the reversal material 6B are performed, for example, for each layer of wafer processing. Because of this, a semiconductor device (semiconductor integrated circuit) is manufactured. Specifically, after a process of forming the imprint pattern 21 is performed, a process of filling the imprint pattern 21 with the reversal material 6A is performed. Subsequently, a process of forming the reversed pattern using the reversal material 6B is performed, and thereafter a process of forming a film on the reversed pattern is performed. When a semiconductor device is manufactured, the process of forming the imprint pattern 21, the process of filling the imprint pattern 21 with the reversal material 6A, the process of forming the reversed pattern using the reversal material 6B, and the process of forming a film on the reversed pattern are repeated for each of the layers.

In this way, according to the third embodiment, since the imprint pattern 21 is filled with the reversal material 6A in a state in which the pressure in the vicinity of the imprint pattern 21 is reduced, the surface tension of the reversal material 6A increases. In addition, since the imprint pattern 21 is filled with the reversal material 6A in a state in which the reversal material 6A is cooled, the surface tension of the reversal material 6A increases. Accordingly, the concave portions of the imprint pattern 21 can be filled with the reversal material 6A uniformly at high speed.

As such, according to the first to third embodiments, the reversal material 6A that can reverse the imprint pattern on the wafer W can be formed as a film without causing damage to the underlying film on the wafer W.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of forming a film, comprising:
    forming a first pattern on a first substrate;
    supplying a pattern material on a second substrate, the pattern material being a reversal material, the second substrate being different from the first substrate;
    filling the first pattern with the pattern material using a capillary phenomenon by bringing the first pattern into contact with the pattern material such that the first pattern faces the pattern material, the pattern material being on the second substrate; and
    separating the second substrate from the pattern material with the pattern material left between convex portions of the first pattern on the first substrate.

2. The method of forming a film according to claim 1, wherein the pattern material is supplied to the second substrate by spin coating.

3. The method of forming a film according to claim 1, wherein the reversal material is supplied to the second substrate by ink jet coating.

4. The method of forming a film according to claim 1, wherein the first pattern is filled with the pattern material in a state in which the vicinity of the first pattern is put under reduced pressure lower than atmospheric pressure.

5. The method of forming a film according to claim 1, wherein the first pattern is filled with the pattern material in a state in which the pattern material is cooled such that a temperature of the pattern material is lower than an outside temperature of an apparatus which fills with the pattern material.

6. A method of forming a pattern, comprising:
    forming a first pattern on a first substrate;
    supplying a pattern material on a second substrate, the pattern material being a reversal material, the second substrate being different from the first substrate;
    filling the first pattern with the pattern material using a capillary phenomenon by bringing the first pattern into contact with the pattern material such that the first pattern faces the pattern material, the pattern material being on the second substrate;
    separating the second substrate from the pattern material with the pattern material left between convex portions of the first pattern on the first substrate; and
    forming a second pattern with the pattern material by removing the first pattern from the first substrate such that the pattern material remains on the first substrate, the second pattern being a reverse of the first pattern.

7. The method of forming a pattern according to claim 6, wherein the pattern material is supplied to the second substrate by spin coating.

8. The method of forming a pattern according to claim 6, wherein the reversal material is supplied to the second substrate by ink jet coating.

9. The method of forming a pattern according to claim 6, wherein the first pattern is filled with the pattern material in a state in which the vicinity of the first pattern is put under reduced pressure equal to or lower than atmospheric pressure.

10. The method of forming a pattern according to claim 6, wherein the first pattern is filled with the pattern material in a state in which the pattern material is cooled such that a temperature of the pattern material is lower than an outside temperature of an apparatus which fills with the pattern material.

11. The method of forming a pattern according to claim 6, wherein the reversal material is cured by heating the reversal material with which the reversed pattern is filled.

12. The method of forming a pattern according to claim 6, wherein the pattern material is cured by illuminating, with UV light, the pattern material with which the first pattern is filled.

13. A method of manufacturing a semiconductor device, comprising:
    forming a first pattern on a first substrate;
    supplying a pattern material on a second substrate, the pattern material being a reversal material, the second substrate being different from the first substrate;
    filling the first pattern with the pattern material using a capillary phenomenon by bringing the first pattern into contact with the pattern material such that the first pattern faces the pattern material;
    separating the second substrate from the pattern material; and
    forming a desired layout pattern with the pattern material by removing the first pattern from the first substrate such that the pattern material remains on the first substrate.

14. The method of manufacturing a semiconductor device according to claim 13, wherein the pattern material is supplied to the second substrate by spin coating.

15. The method of manufacturing a semiconductor device according to claim 13, wherein the reversal material is supplied to the second substrate by ink jet coating.

16. The method of manufacturing a semiconductor device according to claim 13, wherein the first pattern is filled with the pattern material in a state in which the vicinity of the first pattern is put under reduced pressure equal to or lower than atmospheric pressure.

17. The method of manufacturing a semiconductor device according to claim 13, wherein the first pattern is filled with the pattern material in a state in which the pattern material is cooled such that a temperature of the pattern material is lower than an outside temperature of an apparatus which fills with the pattern material.

18. The method of manufacturing a semiconductor device according to claim 13, wherein the reversal material is cured by heating the reversal material with which the reversed pattern is filled.

19. The method of manufacturing a semiconductor device according to claim 13, wherein the pattern material is cured by illuminating, with UV light, the pattern material with which the first pattern is filled.

20. The method of forming a film according to claim 1, wherein the first pattern includes the convex portions supplied at first intervals in a first region on the first substrate and the convex portions supplied at second intervals in the first region on the first substrate, the second intervals being different from the first intervals.

21. The method of forming a pattern according to claim 6, wherein the first pattern includes the convex portions supplied at first intervals in a first region on the first substrate and the convex portions supplied at second intervals in the first region on the first substrate, the second intervals being different from the first intervals.

22. The method of forming a pattern according to claim 6, wherein the first pattern is selectively removed by etching.

23. The method of manufacturing a semiconductor device according to claim 13, wherein the first pattern is selectively removed by etching.

* * * * *